United States Patent [19]

Lamnabhi et al.

[11] Patent Number: 4,860,310
[45] Date of Patent: Aug. 22, 1989

[54] DUOBINARY ENCODED SIGNAL DECODER

[75] Inventors: Moustanir Lamnabhi, Limeil-Brevannes; Philippe Salembier, Paris, both of France

[73] Assignee: U.S. Philips Corporation, New York, N.Y.

[21] Appl. No.: 164,620

[22] Filed: Mar. 7, 1988

[30] Foreign Application Priority Data

Mar. 6, 1987 [FR] France ................... 87 03085

[51] Int. Cl.$^4$ .................................. H04L 1/00
[52] U.S. Cl. ...................... 375/18; 358/13; 371/43; 375/27; 375/34; 375/94
[58] Field of Search .............. 371/43; 375/18, 25, 375/27, 34, 94, 99; 358/13, 133, 138

[56] References Cited

U.S. PATENT DOCUMENTS 4,757,506 7/1988 Heichler ........................ 371/43

Primary Examiner—Benedict V. Safourek
Attorney, Agent, or Firm—Michael E. Marion

[57] ABSTRACT

A device for decoding a transmitted sequence of duobinary encoded signals, which provides as an output a sequence of binary signals which most probably matches the transmitted sequence of duobinary encoded signals, estimated as a function of the duobinary signals actually received by the device.

12 Claims, 2 Drawing Sheets

DUOBINARY ENCODED SIGNAL DECODER

BACKGROUND OF THE INVENTION

The present invention relates to a device for decoding signals received at the output of a transmission channel after duobinary encoding of a sequence of binary digital signals. This duobinary signal decoder is particularly suitable for use in television signal receivers in accordance with the so-called D2-MAC/packet standard.

In television, the introduction of colour was at that time realised by adding what are referred to as colour difference signals or chrominance signals to the luminance signal Y. But an examination of the spectrum of the video signal thus obtained has shown that the luminance and chrominance information components may mix resulting in interferences which are known as cross-luminance and cross-chrominance.

The recently developed MAC transmission standard obviates this drawback. This new standard which is intended to ensure the broadcasting of a set of information components, both analog (luminance, chrominance) and digital (sound, synchronizing signals, any commentaries or subtitle elements, ...) within the band limits of a transmission channel, provides a time-division multiplexing of these different information components in a television line, for example in the following manner:

a digital information component: 10 microseconds;
chrominance: 17.5 microseconds;
luminance: 35 microseconds.

There are several versions of this MAC standard. France has adopted as broadcast standard, the so-called D2-MAC/packet version, in which the bit stream is of the order of 10 mbit/s and the coding used is duobinary. Unfortunately, the performance of this D2-MAC/packet standard in difficult receiving conditions (for example satellite transmissions having a low signal-to-noise ratio) is restricted by the audio selection of the transmission system in which said standard can be used. Tests have indeed demonstrated that for a signal/noise ratio of approximately 13 dB on an amplitude-modulation link the decoding of the digital signals in the receiving section of the transmission system is effected with an error rate of $10^{-3}$, which is considered to be the receiving limit for sound, while the picture still remains acceptable.

SUMMARY OF THE INVENTION

The invention has for its object to provide a duobinary signal decoder in which this limitation is remedied to enhance the performances of the D2-MAC/packet standard.

To that end, the invention relates to a decoding device as defined in the opening paragraph and which is characterized in that it comprises:

(A) a first stage for determining and construction binary paths which comprises:
   (a) first, second and third memories for storing respective conditional probabilities $P(y/0)$, $P(y/1)$, $P(y/2)$, receiving at the instant $kT$, wherein k is the order of consecutive digital samples, a duobinary signal y when a duobinary signal $x=0$, 1 or 2 has been transmitted upstream of the transmission channel, said storage memories being addressed in parallel by the received signal y for deriving the corresponding probabilities.
   (b) first and second selection and storage circuits for two conditional probabilities, which at the instant $(k+1)T$ correspond to the two most probable binary sequences—or paths—, the first circuit being provided at the output of the first and second storage memories and the second at the output of the second and third storage memories;
   (c) a circuit for progressively reconstructing the binary paths thus selected and selecting the most probable path of the two;
(B) a second stage which inhibits exceeding of the storage capacity in said selection and storing circuits of the first stage, provided at the output of these two circuits to form a feed-back loop to the inputs of said circuits.

Actually, after several cycles in which the described binary path determining and construction operations have been performed, the storage means of said selection and probability storing circuits will not be sufficient anymore to contain the information components received. The proposed feedback loop then resolves this problem of capacity overflow: actually, since in the arrangement according to the invention operations are performed on the relative values and not on the absolute values, said feedback loop realizes in said storage means in an adequate subtraction to avoid exceeding of the capacity.

The tests performed, both by simulation and by actual operation, have shown that such a structure effectively leads to performances which are superior to those of conventional decoders.

In a further advantageous embodiment of the decoding arrangement according to the invention, said binary path determining and constructon stage is characterized:

(1) in that the first and second selection and conditional probability storage circuit comprises:
   ($b_1$) first and second multipliers respectively third and fourth multipliers which at their first inputs receive the output from the probability storage memories and calculate the quantities $P(y/0) \cdot LI(0,k)$ and $P(y/1) \cdot LI(1,k)$ or $P(y/1) \cdot LI(0,k)$ and $P(y/2) \cdot LI(1,k)$ respectively, in which quantities $LI(0,k)$ and $LI(1,k)$ designate probabilities which are associated with said two paths which were previously selected by these same selection and storage circuits and applied to second inputs of said multipliers;
   ($b_2$) first and second comparators, respectively for comparing the output values of the first and second respectively the third and fourth multipliers, for the purpose of selecting the larger of the two probabilities present at the output of the first and the second multipliers and of the third and fourth multiplier respectively;
   ($b_3$) first and second storage registers, respectively, for said associated probabilities thus selected, whose outputs are fedback to the second inputs of the multipliers;
(2) in that the binary path reconstruction circuit comprises:
   ($c_1$) two shift registers for the respective storage of the two binary sequences corresponding to the two probabilities selected by the selection and the storing circuit, respectively;

(c₂) a third comparator for comparing the output signals of the two probability storage registers which are respectively selected by the selection and storage circuits, for the purpose of selecting the larger of these two probabilities and the one of the two binary sequences being stored in said shift register which corresponds thereto.

In a variation of this embodiment the probabilities are replaced by their decimal logarithm which renders it possible to substitute adders for the multipliers.

In either case, the second stage for inhibiting the storage capacity from being exceeded, comprises, arranged in series:

(d) a switching circuit connected to the output of the third comparator for selecting, under the control of this comparator one of the two probabilities previously selected by each selection and storage circuit;

(e) a circuit for calculating a fraction of the probability selected by said switching circuit;

(f) a set of three parallel-arranged subtractors which are provided between, respectively, the output of the conditional probability storage memories and the input of the corresponding multipliers or adders in the selection and storage circuit. Thus the stability of the decoder device is guaranteed, without any disadvantageous effect on the working rate.

BRIEF DESCRIPTION OF THE DRAWINGS

Particulars and advantages of the invention will now become more apparent from the following description, which is given by way of non-limitative example with reference to the accompanying drawings and in which.

DETAILED DESCRIPTION OF THE INVENTION

Before a description is given of the decoder of the invention, it should be noted that the principle of the duobinary encoder provided in the transmission section of the transmission link, upstream of the transmission channel i.e. before the transmission channel, is based on the operation of adding together the two consecutive bits of the binary encoded signal. The duobinary signal thus formed then passes through the transmission channel where it is disturbed by an additive noise. This disturbance will have for its effect that on reception a signal is available which fluctuates around the transmitted levels instead of a proper duobinary digital signal.

Figure 1:
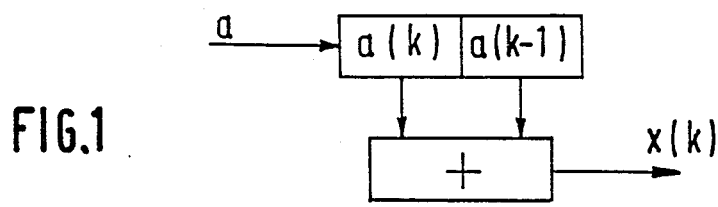
FIG. 1 shows the basic circuit diagram of a duobinary encoder.

At the output of the encoder shown in FIG. 1, the signal x(k), k being the order of the binary or duobinary digital samples, which are the result of the addition of the consecutive binary samples a(k−1) and a(k), having values equal to 0 or 1, and which itself assumes the value 0, 1 or 2. The correspondence between the values of a(k−1) and a (k) and of the values of x(k) is consequently as follows: the pairs of respective a(k/1), a(k) values 00, 01, 10, 11 correspond to x(k) values 0, 1, 1 and 2.

Figure 2A:
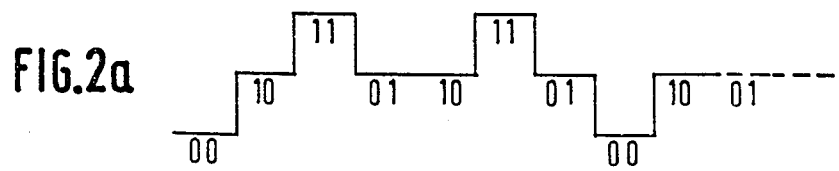
FIG. 2a shows a possible type of a duobinary sequence at the output of this encoder and the FIGS. 2b and 2c show two impossible types of sequences.
Figure 2B:
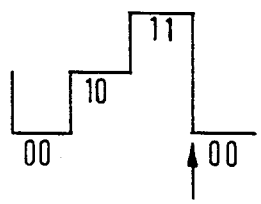
Figure 2C:
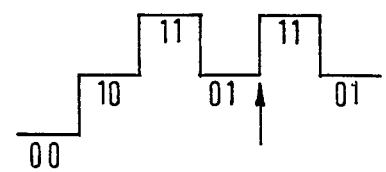

FIG. 2a shows a possible type of sequences at the output of the encoder whereas the FIGS. 2b and 2c show in contrast thereto two examples of sequences which are impossible, as it is not possible for the set a(k), a(k−1) to pass directly from the value 11 to the value 00 without passing through the value 01, nor from the value 01 to the value 11 without passing through the value 10.

Figure 3:
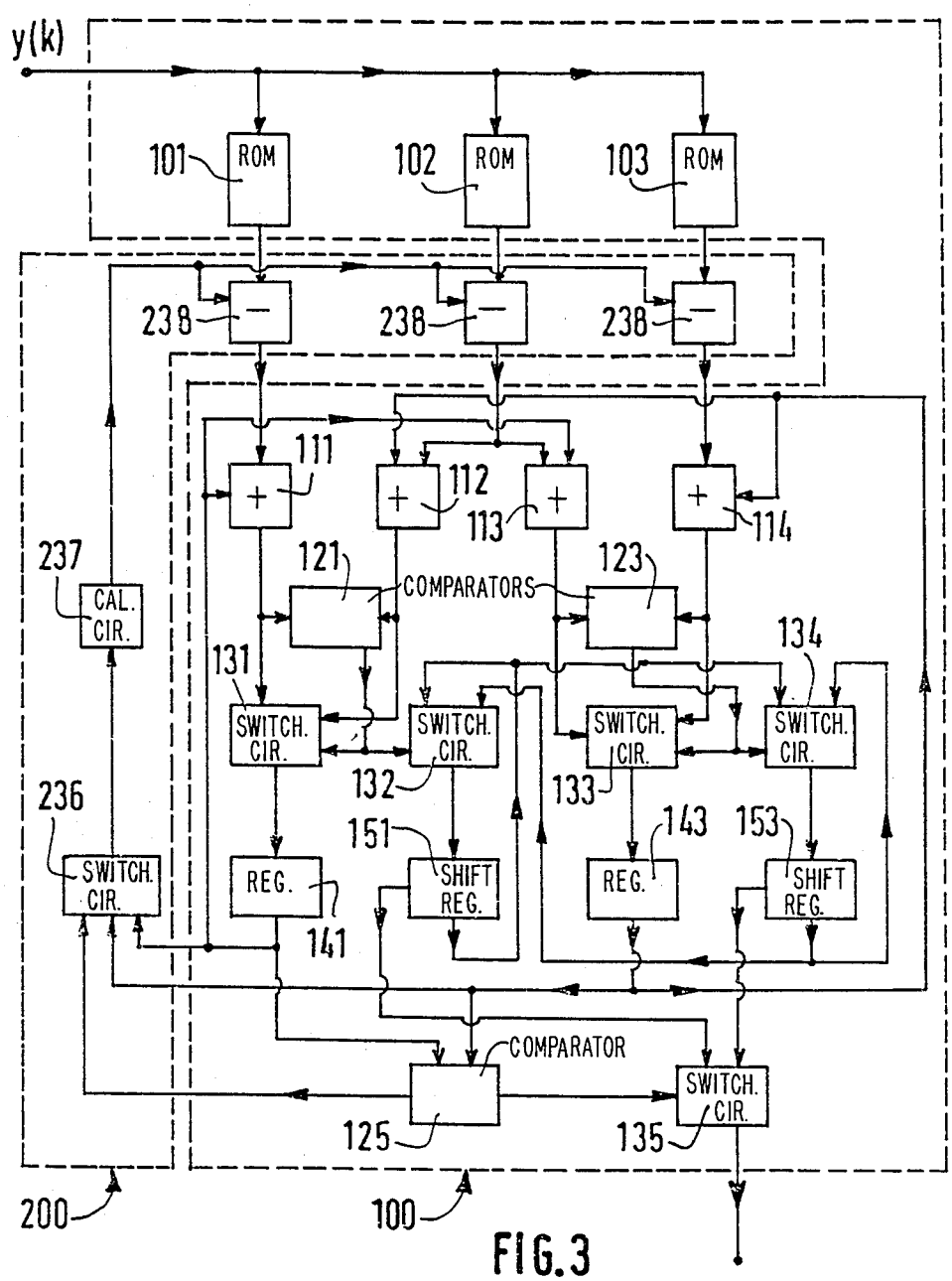
FIG. 3 shows an embodiment of the decoder device according to the invention.

After this detailed explanation the decoder according to the invention will now be described. This decoder comprises as is shown in FIG. 3 two sets of circuits. A first set of circuits forming a first stage 100 for the determination and construction of two binary paths of most likelihood sequence estimation i.e. having the largest probability. A second set of circuits forming a second stage 200 which inhibits exceeding of the storage capacity. The decoder is provided at the output of a transmission channel, not shown, at whose input the transmitted signal is indicated by x(k). The signal received by the decoder at the output of the channel is designated y(k). Since on transmission a duobinary encoding has been applied, x(k) is here consequently, as is mentioned in the foregoing, equal to 0, to 1 or to 2.

It has been demonstrated that this signal which is received in correspondence with each of the transmitted digital signals was disturbed during its transmission and then fluctuated around these digital levels. To determine to which transmitted signal (0, 1 or 2) the received signal y(k) corresponds, a conventional decoder would use the two-threshold comparison principles. Accordingly if y(k) is below the lower threshold, this conventional decoder would decide that the transmitted signal was 0, 1 or 2, respectively. In such a decoder the result of the comparison is then obviously totally independent of a subsequently received signal, that is to say the decision with respect to a transmitted sample x(k), taking account of the corresponding, actually received value of y(k) does not influence the decision as regards the sample x(k+1) to which, on reception, a value y(k+1) corresponds. This has for its effect that it would be possible to detect a transition from, for example, 0 to 2, while, as already mentioned, certain situations can never occur. Therefore, the conventional decoder does not utilize the dependency which actually exists between the transmitted symbols.

The decoder in accordance with the invention makes advantageous use of this redundancy in the duobinary signal and, by using the Viterbi algorithm, applies itself more specifically to an estimation, as a function of the sequence Y(D) of the received duobinary signals, of the better sequence X(D) of the transmitted duobinary samples. A better sequence must here be understood to mean that sequence which is the most probable, that is to say a sequence whose successive duobinary samples . . . , x(k−1), x(k), x(k+1), etc. . . . are with a maximum of probability those, which gave rise to the received sequence. . . . , y(k−1), y(k), y(k+1), etc. . . . .

Figure 4:
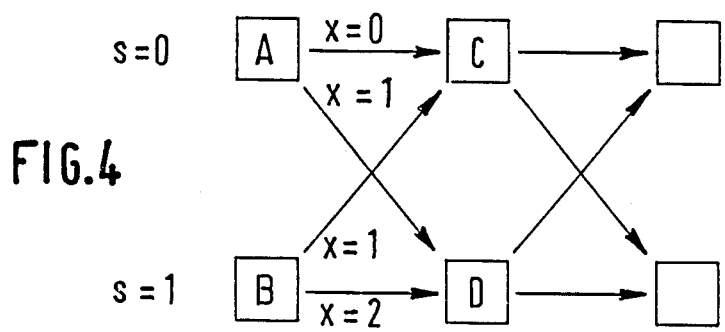
FIG. 4 shows the successive state of the duobinary encoder on transmission.

It is known that the Viterbi algorithm is based on the principle of comparing probabilities associated with the estimated sequences. To that end, for each received signal y, the three probabilities P(y/0), P(y/1), P(y/2) which represent the probabilities of having effectively received y knowing that the emitted duobinary sample x was 0, 1 or 2 respectively, are considered. Moreover, FIG. 4 shows the succession of states of the duobinary encoder on transmission. If a(k), a(k+1), etc. . . . are the successive binary samples at the input of the encoder, the respective states s(k), s(k+1), s(k+2) etc. . . . of the encoder are designated as being the preceding binary sample values a(k−1), a(k), a(k+1) etc. . . . . The nodes of the lattice then designate the states, and the transitions x(k) between the nodes designate the actually transmitted duobinary samples.

At the instant (k−1)T, where T is the duration of each symbol, two sequences or binary paths, one of which arrives at A with a probability α and the other at B with a probability β will not be considered. At the subsequent instant kT, a signal y(k) is received by the decoder. The corresponding conditional probabilities P(y/0), P(y/1), P(y/2) can then be calculated. The register of the decoder which contains a(k) can only assume two states, 0 or 1. At the instant kT the node D, for example, can then only be reached in two different manners, namely:

(a) the path which ends at B, with subsequent supply of a high level (the content of the register a(k) is maintained at 1) this path having the probability β×P(y/2);

(b) the path which ends at A and thereafter leads to D (the contents of the register a(k) is set to 1) this path having the probability α×P(y/1) (the probabilities can be multiplied by each other, as in the present case, the binary symbols are independent random variables and the noise samples are decorrelated).

Of the two probabilities α·P(y/1) and β·P(y/2) thus determined, only the larger is preserved which corresponds to the most probable path to arrive at point D. Two binary paths arrive at point C in a similar manner:

(a) that path which ends at point B and thereafter leads to C (the content of the register a(k) being set to 0), and which has the probability β·P(y/1);

(b) that path which ends at point A with subsequent supply of a level (the content of the register a(k) is kept at 0) and which has the probability α·P(y/0). Also in this, case only the binary path whose probability is largest, is preserved.

Two complete binary paths can thus be progressively constructed from node to node of the lattice. Finally, by a decision, that one of the two paths thus constructed must be chosen which presents the maximum of probability. The Viterbi algorithm is optimal if the transmitted sequence is infinitely retained in the memory. In actual practice, taking account of the characteristics of the duobinary code, it will be found that the two structured binary paths are almost certainly mutually identical from a given bit, the fifth or the sixth bit, which avoids the need for a significant large storage of information previous to the decision.

If registers 151 and 153 are chosen sufficiently large then their output bits, i.e. their oldest bits, have mutually the same value and circuit 135 can be omitted.

Making the process according to the foregoing operative is realised in the following way. The duobinary signals which succeed each other serially at the output of the transmission channel are received by first, second and third read-only memories 101, 102, 103, of the PROM type (programmable read-only memory), which are addressable. The PROM memories 101 to 103 contain the respective previously known probabilities P(y/0), the probabilities P(y/1) and the probabilities P(y/2), which are determined by channel transmission properties relating to e.g. transmission noise, intersymbol interference, etc. In the present case, preference is given to storing in these memories the decimal logarithm of the probabilities instead of their actual value, so as to allow the use of adders instead of multipliers downstream of said memory.

Subsequent to the PROM memories 101 to 103 which are addressed by the received duobinary signals, there are therefore provided, in the preferred embodiment described, first to fourth adders 111 to 114. The adders 111 and 112 calculate $\log_{10}(P(y/0) \cdot LI(0,k))$ and $\log_{10}(P(y/1) \cdot LI(0,k))$ and $\log_{10}(P(y/2) \cdot LI(1,k))$ and are therewith functioning as multipliers. In these expressions, the values LI(0,k) and LI(1,k) are the probabilities of the two previously selected paths, and are contained in the two above-mentioned registers.

A first comparator 121 compares the output signal of the adder 111 with the output signal of the adder 112 and a second comparator 123 compares the output signal of the adder 113 with the output signal of the adder 114. The result of the comparison effected in the comparator 121 controls the selection of one out of the two probabilities P(y/0)·LI(0,k) and P(y/1)·LI(1,k) (the one that is the highest) and of the corresponding binary path, while, in a similar manner, the result of the comparison effected in the comparator 123 controls the selection of one out of the two probabilities P(y/1)·LI(0,k) and P(y/2)·LI(1,k) and of the corresponding binary path. The probability selected subsequent to the control command by the comparator 121 is then stored in register 141 of the two registers 141 and 143 mentioned in the foregoing, where from now on said probability represents the value LI(0,k+1), which is as such conveyed to one of the two inputs of the two adders 111 and 113 for a new start of the operations performed therebefore. Similarly, the probability selected by a comparator 123 is stored in the other register 143, where it constitutes the value LI(1,k+1), which as such is conveyed to one of the two inputs of the two adders 112 and 114.

This double determination of the most probable binary paths allows an appropriate reconstruction of these two paths, denoted the surviving paths. Actually, shift registers 151 and 153 store the binary sequences constituting these paths, more specifically in a truncated manner since it has been described in the foregoing that the two paths are almost certainly mutually merging from a given number of bits. At each cycle of the above-described operations, a 0 is added to the surviving path which terminates in the node 0 of the lattice and a 1 in the surviving path terminating in the node 1. At the same time, at the other extreme end of each of these shift registers 151 and 153 the oldest bit is extracted.

That one of these two oldest bits with which the highest probability is associated is selected to constitute the estimated output signal. This selection is rendered possible by a comparaator 125 having two inputs whereas the respective contents of the two registers 141 and 143 are received, that is to say the probabilities which were previously selected by the comparator 121 and 123, and validates, depending on which one of these two probabilities is the highest (the one contained in the register 141 or the one contained in the register 143), either the oldest bit extracted from the shift register 151 or the oldest bit extracted from the shift register 153. This selected bit constitutes the output signal of the arrangement and the sequence of these bits selected in each operating cycle constitutes an estimated reconstruction of the transmitted binary sequence.

The selection effected by means of the comparators 121 and 123, thereafter by means of the comparator 125, is actually realized with the aid of switching circuits 131, 133, 135. Actually the switching circuit 131 receives on the one hand at first and second inputs the probabilities (in fact their logarithms as has been described in the foregoing with regard to the example in question) $P(y/0)\cdot LI(0,k)$ and $P(y/1)\cdot LI(1,k)$ produced by the adders 111 and 112, and on the other hand at the third input the control command transmitted by the comparator 121. The output of the switching circuit 131 which is constituted by the selected probability is connected to the input of the register 141.

Similarly, the switching circuit 133 receives at first and second inputs the probabilities $P(y/1)\cdot LI(0,k)$ and $P(y/2)\cdot LI(1,k)$ and, at a third input, the control command transmitted by the comparator 123, and the output of this circuit 133 is connected to the input of the register 143. The two probabilities thus selected are those which are conveyed to the two inputs of the comparator 125, to determine which one is the larger. At the same time, the switching circuit 135 receives at first and second inputs the two oldest bits from the shift registers 151 and 153 and supplies at its output, at a control signal coming from the output of the comparator 125, the bit which was selected as being the output signal of the arrangement, that is to say the estimated bit for a predetermined transmitted bit.

The selection effected by the comparator 121 and 123 necessitates not only to control the switching circuits 131 and 133 but also switching circuits 132 and 134 having a control input in common with the latter switching circuits 131 and 133, respectively. Each of the switching circuits 132 and 134 receives the output from the registers 151 and also the output from the register 153 and conveys to the corresponding shift register 151 or 153 that one of these two outputs which has been selected by the control signal coming from the respective comparators 121 and 123.

The arrangement described in the foregoing is provided with a circuit which inhibits exceeding of the capacity of the registers 141 and 143. This circuit includes a switching circuit 236 which is arranged in parallel with the comparator 125 and consequently receives the same two probabilities selected by the comparators 121 and 123, that is to say the probabilities available at the output of the registers 141 and 143. Then the switching circuit 236 supplies, under the control of the comparator 125, one of these two probabilities, for example the smallest of the two. To prevent the capacity of the last-mentioned registers from being exceeded a value derived from the value of the last-mentioned smallest probability is subtracted from the output of the memories with the aid of three subtractors 238 arranged between the output of these memories and the inputs of the adders 111 to 114. Said value is a calculated fraction of the probability, obtained, for example by dividing the probability by two, by three etc. . . . in a calculating circuit 237 which in the present case is a divider, provided in any case that this value which is subtracted with the aid of the subtractors 238 depends on the delay to which the relative signals are submitted during the performing of the operatons in the switching circuits 236, in this calculating circuit 237, and in the subtractors 238 themselves, and must be increased according as this delay is greater.

What is claimed is:

1. A device for decoding signals comprising a sequence of binary samples which have been duobinary encoded and transmitted over a transmission channel, comprising:

(a) means coupled to the output of said transmission channel, for determining for a received duobinary value y corresponding to a transmitted duobinary value x, first, second and third conditional probabilities corresponding respectively to the probability that $x=0$, $x=1$, and $x=2$ at an instant kT, where k is the order of consecutive binary samples;

(b) first selecting means coupled to said determining means for selecting the two of said conditional probabilities which at the instant $(k+1)T$, corresponds to two more probable binary sequences; and (c) second selecting means coupled to said first selecting means for selecting the most probable of said two more probable binary sequences.

2. The device of claim 1 wherein said determining means comprises first, second and third storage memories addressable by said received duobinary value y and containing said first, second and third probabilities corresponding thereto which are provided by said first, second and third storage memories respectively.

3. The device of claim 2 wherein said first selecting means comprises first and second selection and storage circuits each having an input, said input of said first selection and storage circuit is coupled to said first and second storage memories, said input of said second selection and storage circuit is coupled to said second and third storage memories, said first and second selection and storage circuits include storage means for storing and providing at an output said conditional probabilities associated with said more probable sequences.

4. The device of claim 3 further comprising means for coupling said output of said storage means to said inputs of said first and second selection and storage circuits so as to form a feedback loop, said coupling means additionally acting to inhibit said first and second selection and storage circuits from exceeding their storage capacity.

5. The device of claim 4 wherein said first and second selection and storage circuits further comprise:

(a) first, second, third and fourth multipliers each having first and second inputs and an output, said first inputs are coupled to said storage memories for receiving said first, second and third probabilities and said second inputs are coupled to said storage means, said multipliers calculating and providing at respective outputs a first product $P(y/0)\cdot LI(0,k)$, a second product $P(y/1)\cdot LI(1,k)$, a third product $P(y/1)\cdot LI(0,k)$ and a fourth product $P(y/2)\cdot LI(1,k)$, where $P(y/0)$, $P(y/1)$ and $P(y/2)$ represent said first, second and third probabilities and $LI(0,k)$ and $LI(1,k)$ represent the probabilities of two previously selected more probable binary sequences; and (b) a first comparator for comparing said first and second products and selecting a first larger probability and a second comparator for comparing said third and fourth products and selecting a second larger probability.

6. The device of claim 5 wherein said storage means comprises first and second storage registers coupled respectively to said first and second comparators, for storing said first and second larger probabilities respectively, having first and second outputs coupled to said second inputs of said multipliers.

7. The device of claim 6 wherein said second selecting means comprises:

(a) first and second shift registers each storing one of two more probable binary sequences corresponding to said first and second larger probabilities; and (b) a third comparator for comparing the outputs of said first and second storage registers and selecting the larger of these outputs and the corresponding one of the two more probable binary sequences stored respectively in said first and second shift registers which represents said most probable binary sequence.

8. A device as claimed in claim 7 characterized in that said coupling means comprises, arranged in series:
- a switching circuit connected to the output of the third comparator for selecting, under the control of the comparator one of the two probabilities previously selected by each selection and storage circuit;
- a circuit for calculating a fraction of the probability selected by said switching circuit;
- a set of three parallel-arranged dividers which are provided between, respectively, said first, second and third storage memories and the input of the corresponding multipliers.

9. The device of claim 4 wherein said first and second selection and storage circuits further comprise:
(a) first, second, third and fourth adders each having first and second inputs and an output, said first inputs are coupled to said storage memories for receiving said first, second and third probabilities and said second inputs are coupled to said storage means, said adders calculating and providing at respective outputs a first product $\log_{10}(P(y/0) \cdot LI(0,k))$, a second product $\log_{10}(P(y/1) \cdot LI(1,k))$ a third product $\log_{10}(P(y/1) \cdot LI(0,k))$ and a fourth product $\log_{10}(P(y/2) \cdot LI(1,k))$ where $P(y/0)$, $P(y/1)$ and $P(y/2)$ represent said first, second and third probabilities and $LI(0,k)$ and $LI(1,k)$ represent the probabilities of two previously selected more probable binary sequences; and
(b) a first comparator for comparing said first and second products and selecting a first larger probability and a second comparator for comparing said third and fourth products and selecting a second larger probability.

10. A device as claimed in claim 9 characterized in that said coupling means comprises, arranged in series:
- a switching circuit connected to the output of the third comparator for selecting, under the control of this comparator one of the two probabilities previously selected by each selection and storage circuit;
- a circuit for calculating a fraction of the probability selected by said switching circuit;
- a set of three parallel-arranged dividers which are provided between, respectively, said first, second and third storage memories and the input of the corresponding adders.

11. The device of claim 5 wherein said storage means comprises first and second storage registers coupled respectively to said first and second comparators, for storing the decimal logarithms of said first and second larger probabilities respectively, having first and second outputs coupled to said second inputs of said adders.

12. The device of claim 11 wherein said second selecting means comprises:
(a) first and second shift registers each storing one of two more probable binary sequences corresponding to said first and second larger probabilities; and
(b) a third comparator for comparing the outputs of said first and second storage registers and selecting the larger of these outputs and the corresponding one of the two more probable binary sequences stored respectively in said first and second shift registers which represents said most probable binary sequence.

* * * * *